(12) United States Patent
Lian et al.

(10) Patent No.: US 8,344,810 B2
(45) Date of Patent: Jan. 1, 2013

(54) CMOS AMPLIFIER WITH INTEGRATED TUNABLE BAND-PASS FUNCTION

(75) Inventors: Yong Lian, Singapore (SG); Libin Yao, Singapore (SG); Xiaoyuan Xu, Singapore (SG); Xiaodan Zou, Singapore (SG)

(73) Assignee: National University of Singapore, Singapore (SG)

( * ) Notice: Subject to any disclaimer, the term of this patent is extended or adjusted under 35 U.S.C. 154(b) by 4 days.

(21) Appl. No.: 12/997,357

(22) PCT Filed: Jun. 11, 2009

(86) PCT No.: PCT/SG2009/000209
§ 371 (c)(1),
(2), (4) Date: Mar. 3, 2011

(87) PCT Pub. No.: WO2009/151406
PCT Pub. Date: Dec. 17, 2009

(65) Prior Publication Data
US 2011/0140785 A1    Jun. 16, 2011

Related U.S. Application Data

(60) Provisional application No. 61/060,627, filed on Jun. 11, 2008.

(51) Int. Cl.
*H03F 3/191* (2006.01)
(52) U.S. Cl. ...................................... 330/305
(58) Field of Classification Search .............. 330/86, 330/144, 305
See application file for complete search history.

(56) References Cited

U.S. PATENT DOCUMENTS

| 4,972,098 | A | * | 11/1990 | Boudewijns | ............... 327/566 |
| 5,006,733 | A | | 4/1991 | Brown | |
| 6,944,435 | B2 | | 9/2005 | Contopanagos et al. | |
| 7,710,185 | B2 | * | 5/2010 | Manku | ............... 327/359 |

FOREIGN PATENT DOCUMENTS
WO    WO 98/35438 A2    8/1998

OTHER PUBLICATIONS

Kim, D. et al. "Low-Power Low-Noise Neural Amplifier in 0.18μm FD-SOI Technology", IEEE International Symposium on Circuits and Systems, May 2007, pp. 805-808.
Tajalli, A. et al. "Implementing ultra-high-value floating tunable CMOS resistors", Electronic Letters, 44(4), Feb. 28, 2008.
Yin, M. et al. "A Low-Noise Preamplifier with Adjustable Gain and Bandwidth for Biopotential Recording Applications", IEEE International Symposium on Circuits and Systems, May 2007, pp. 321-324.
Qian, X. et al. "A CMOS Continuous-Time Low-Pass Notch Filter for EEG Systems", Analog Integrated Circuits and Signal Processing, 44, 2005, pp. 231-238.

(Continued)

*Primary Examiner* — Steven J Mottola
(74) *Attorney, Agent, or Firm* — Merchant & Gould P.C.

(57) ABSTRACT

A CMOS amplifier with integrated tunable band-pass function, a tunable active resistor structure, a method of amplifying an input signal and a method of fabricating an amplifier. The tunable active resistor structure comprises two symmetrically cross-coupled transistors.

21 Claims, 9 Drawing Sheets

OTHER PUBLICATIONS

Chan, C. et al. "A Novel Variable-Gain Micro-Power Band-Pass Auto-Zeroing CMOS Amplifier", IEEE International Symposium on ISCAS 2007, May 2007, pp. 337-340.

Wu, H. et al. "A 1V 2.3µW Biomedical Signal Acquisition IC", IEEE International Solid-State Circuit Conference (ISSCC), Feb. 2006, pp. 119-128.

Harrison, R. et al. "A Low-Power Low-Noise CMOS Amplifier for Neural Recording Applications", IEEE Journal of Solid-State Circuits (JSSC), 38(6), Jun. 2003, pp. 958-965.

Wattanapanitch, W. et al. "An Energy-Efficient Micropower Neural Recording Amplifier", IEEE Transactions on Biomedical Circuits and Systems, 1(2), Jun. 2007, pp. 136-147.

* cited by examiner

TABLE I

| Parameter | Measured Result |
| --- | --- |
| Supply Voltage | 1.0 V |
| Supply Current | 337 nA max |
| Mid-band Gain | 45.6 / 49 / 53.5 / 60 dB |
| −3 dB High-pass Corner | 4.5 mHz ~ 3.5 Hz |
| −3 dB Low-pass Corner | 30 ~ 292 Hz |
| Input-Referred Noise | 2.5 $\mu V_{rms}$ (0.05 ~ 460 Hz) |
| Noise Efficiency Factor | 3.26 |
| THD @ Rail-to-Rail Output | < 1% |
| Dynamic Range | 58 dB |
| CMRR | ≥ 71.2 dB (Below 300 Hz) |
| PSRR | ≥ 84 dB (Below 300 Hz) |

FIG. 7

CMOS AMPLIFIER WITH INTEGRATED TUNABLE BAND-PASS FUNCTION

This application is a National Stage Application of PCT/SG2009/000209, filed 11 Jun. 2009, which claims benefit of Ser. No. 61/060,627, filed 11 Jun. 2008 in the United States and which applications are incorporated herein by reference. To the extent appropriate, a claim of priority is made to each of the above disclosed applications.

FIELD OF INVENTION

The present invention relates to a CMOS amplifier with integrated tunable band-pass function, a tunable active resistor structure, a method of amplifying an input signal and to a method of fabricating an amplifier.

BACKGROUND

Biomedical signal acquisition has gained much attention in recent years due to the fast growing market for portable biomedical electronics such as wearable or implantable health monitoring devices. Subthreshold-mode CMOS amplifiers with integrated band-pass functions are often used in such devices to achieve high power efficiency. In order to effectively reject the DC component and baseline drift without distorting the useful bio-signal, such amplifiers need to provide very low high-pass cut-off frequencies (sub 1 Hz). Along with onchip capacitors, MOS-bipolar pseudo-resistors that produce up to $10^{13}$ ohm or even higher resistance are usually employed to realize the said high-pass function, while avoiding the use of external RC components. However, the process dependence and highly nonlinear resistance associated with pseudo-resistors may cause problems such as metastable operational points and unpredictable corner frequencies.

FIG. 1 depicts a typical neural recording amplifier 100 with integrated band-pass function. Assuming that the operational transconductance amplifier (OTA) 102 is ideal, the gain of the overall system is set by the capacitance ratio $C_1$ 112/$C_2$ 114 (or $C_3$ 116/$C_4$ 118); the input DC component is blocked by the high-pass network $C_1$ 112, $M_1$ 122 and $M_2$ 124 (or $C_3$ 116, $M_3$ 126 and $M_4$ 128), whose corner frequency is regulated by $C_2$ 114, $M_1$ 122 and $M_2$ 124 (or $C_4$ 118, $M_3$ 126 and $M_4$ 128). Once the values of these components are determined, the gain and the high-pass corner frequency are fixed. However, they may drift considerably against the design target due to process variations, yet no tuning and adjustment are possible. Furthermore, the resistance provided by the active pseudo-resistors $M_1$ 122 and $M_2$ 124 (or $M_3$ 126 and $M_4$ 128) is asymmetric, which varies when the voltage drops across the pseudo-resistor structure 132 (or 134) are equal in magnitude but opposite in direction. This leads to signal-dependent output drift and degradation in linearity. As the input level increases, the output usually encounters a premature clipping at one of the power rails, which severely degrades the dynamic range.

A few attempts have been made to improve the linearity and dynamic range of such amplifiers. Some of them incorporate features such as tunable bandwidth and programmable gain. Listed below are typical examples of such attempts.

[1] H. Wu and Y. P. Xu, "A 1V 2.3 µW Biomedical Signal Acquisition IC," Proceedings of the 2006 IEEE International Solid-State Circuit Conference (ISSCC), pp. 119-128, February 2006;

[2] R. R. Harrison and C. Charles, "A Low-Power Low-Noise CMOS Amplifier for Neural Recording Applications," IEEE Journal of Solid State Circuits (JSSC), Vol. 38, No. 6, June 2003;

[3] M. Yin and M. Ghovanloo, "A Low-Noise Preamplifier with Adjustable Gain and Bandwidth for Biopotential Recording Applications," Proceedings of IEEE International Symposium on Circuits and Systems (ISCAS), pp. 321-324, May 2007;

[4] W. Wattanapanitch, M. Fee and R. Sarpeshkar, "An Energy-Efficient Micropower Neural Recording Amplifier," IEEE Transactions on Biomedical Circuits and Systems, Vol. 1, No. 2, June 2007.

Although these works have been helpful in correcting certain aspects of the problem, they usually show negative effects on others. For example, enhancing the linearity of active loads may lead to prolonged settling time and diminished possibility for post-fabrication adjustment; on the other hand, incorporating tunability often introduces increased severe imbalance across the structure and produces reduced linearity and dynamic range.

Therefore, there exists a need to provide a low voltage CMOS amplifier with integrated tunable band-pass function, a tunable active resistor structure, a method of amplifying an input signal and a method of fabricating an amplifier which seek to address one or more of the problems mentioned above.

SUMMARY

In accordance with a first aspect of the present invention, there is provided a tunable active resistor structure comprising two symmetrically cross-coupled transistors.

The resistor structure may further comprise a first variable source coupled between a gate of one of the transistors and a source of the other transistor, and a second variable source coupled between a gate of said other transistor and a source of said one transistor for providing tunability to the active resistor structure.

The first and second variable sources may each comprise a variable voltage source.

The variable voltage source may comprise a source transistor for mapping a required voltage drop to a variable current source.

A source and bulk of one of the transistors may be coupled to the gate of the other transistor and vice versa.

The transistors may comprise PMOS transistors.

In accordance with a second aspect of the present invention, there is provided a CMOS amplifier with integrated tunable band-pass function comprising one or more active resistor structures of the first aspect.

The amplifier may comprise a separate pre-amplification stage and a gain tuning stage.

The pre-amplification stage may comprise said active resistor structures.

The transistors of the amplifier may be biased in a sub-threshold region under low-voltage supply operation.

The capacitive inputs of the pre-amplifier stage may be employed to reject DC and predefined low-frequency contents.

The high-pass corner frequency may be arranged for reaching down to sub 1 Hz and is defined by the onchip active resistors.

The active resistors may exhibit substantially no external state related imbalance for reducing or eliminating signal dependent output shift.

The active resistors may exhibit substantially no signal dependent resistance variation for reducing non-linearity.

A THD with rail-to-rail output of the amplifier may be less than 1% for offering a substantially optimum signal amplitude in dynamic range evaluations.

A dominant pole of the amplifier may provide the low-pass function.

The dominant pole may be adjustable by tuning a current of an OTA of the pre-amplification stage.

The amplifier may have a low power consumption of less than 1 μW.

The gain tuning stage may comprise switchable capacitive feedback paths to adjust closed-loop gain.

The amplifier may comprise a switchable capacitor network to flip over between an input and a feedback paths during gain adjustment.

In accordance with a third aspect of the present invention there is provided a method of amplifying an input signal using the amplifier as defined in the second aspect.

In accordance with a fourth aspect of the present invention, there is provided a method of fabricating the amplifier as defined in the second aspect.

BRIEF DESCRIPTION OF THE DRAWINGS

Embodiments of the invention will be better understood and readily apparent to one of ordinary skill in the art from the following written description, by way of example only, and in conjunction with the drawings, in which:

FIG. 7 shows a table concluding some of the measurement results of the example implementation of the invention.

DETAILED DESCRIPTION

The embodiments of the present invention seek to introduce flexibility in bandwidth and gain adjustments for CMOS amplifiers. Secondly, the embodiments seek to provide stable and readily settled biasing points in the presence of large active loads. Thirdly, the embodiments seek to create a circuit topology that inherently favours both tunability and signal fidelity, such that fully adjustable amplifiers are able to produce outputs with reasonable linearity and dynamic range under low supply voltage. As described in the example embodiments, these may be achieved through a pair of fully symmetrical cross-coupled active resistors that tunes the high-pass corner frequency, and a "flip-over-capacitor" structure that tunes the voltage gain.

The detailed description of invention is presented below. Those skilled in the art, however, will realize that it exemplifies but is not limiting the scope of the invention. Without deviating from the main concept and spirit, many of the details described hereinafter can be readily modified and applied in conjunction with other techniques in the art to conform to different design requirements.

Figure 1:
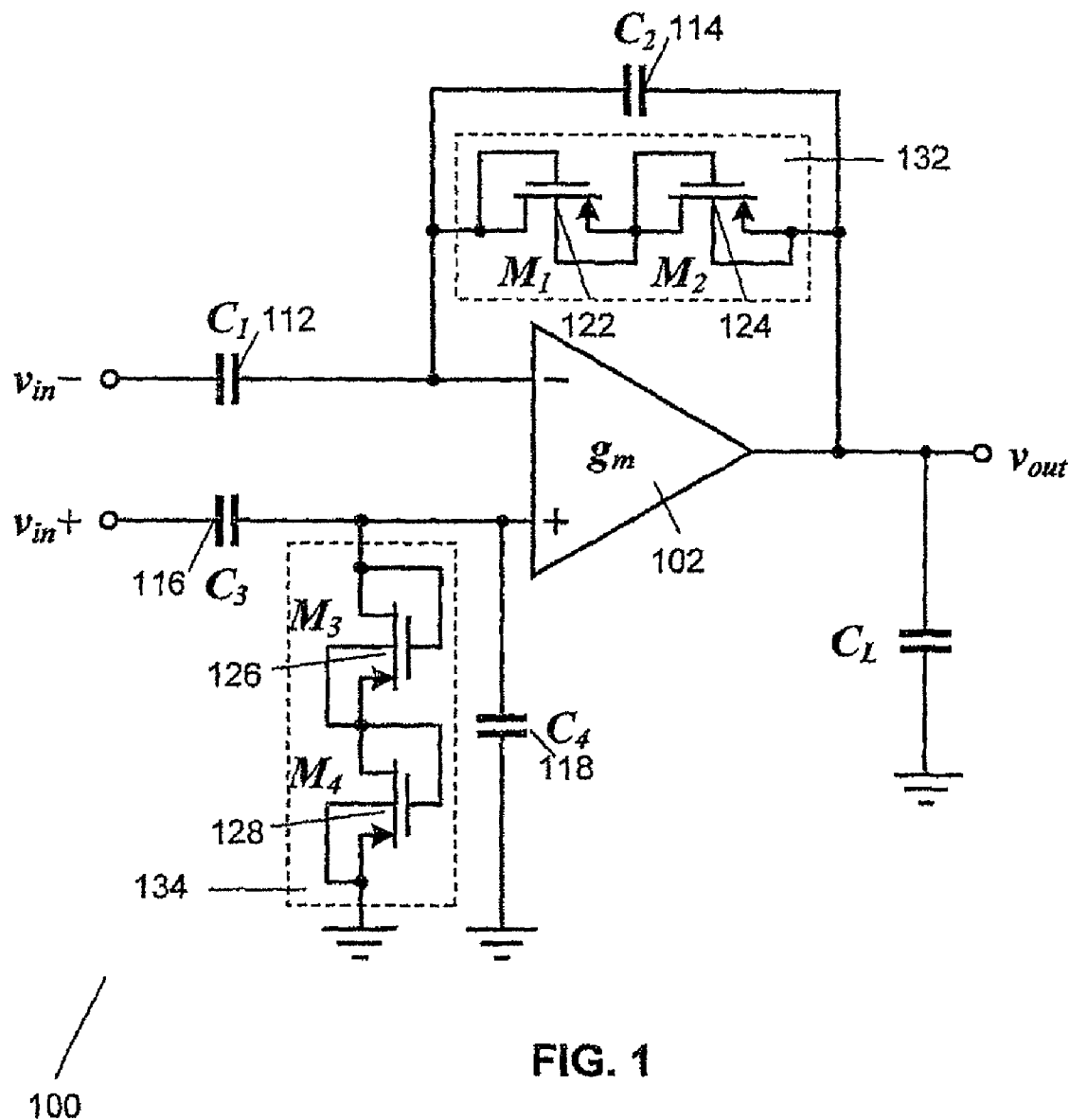
FIG. 1 shows a neural recording amplifier in the state of the art.
Figure 2:
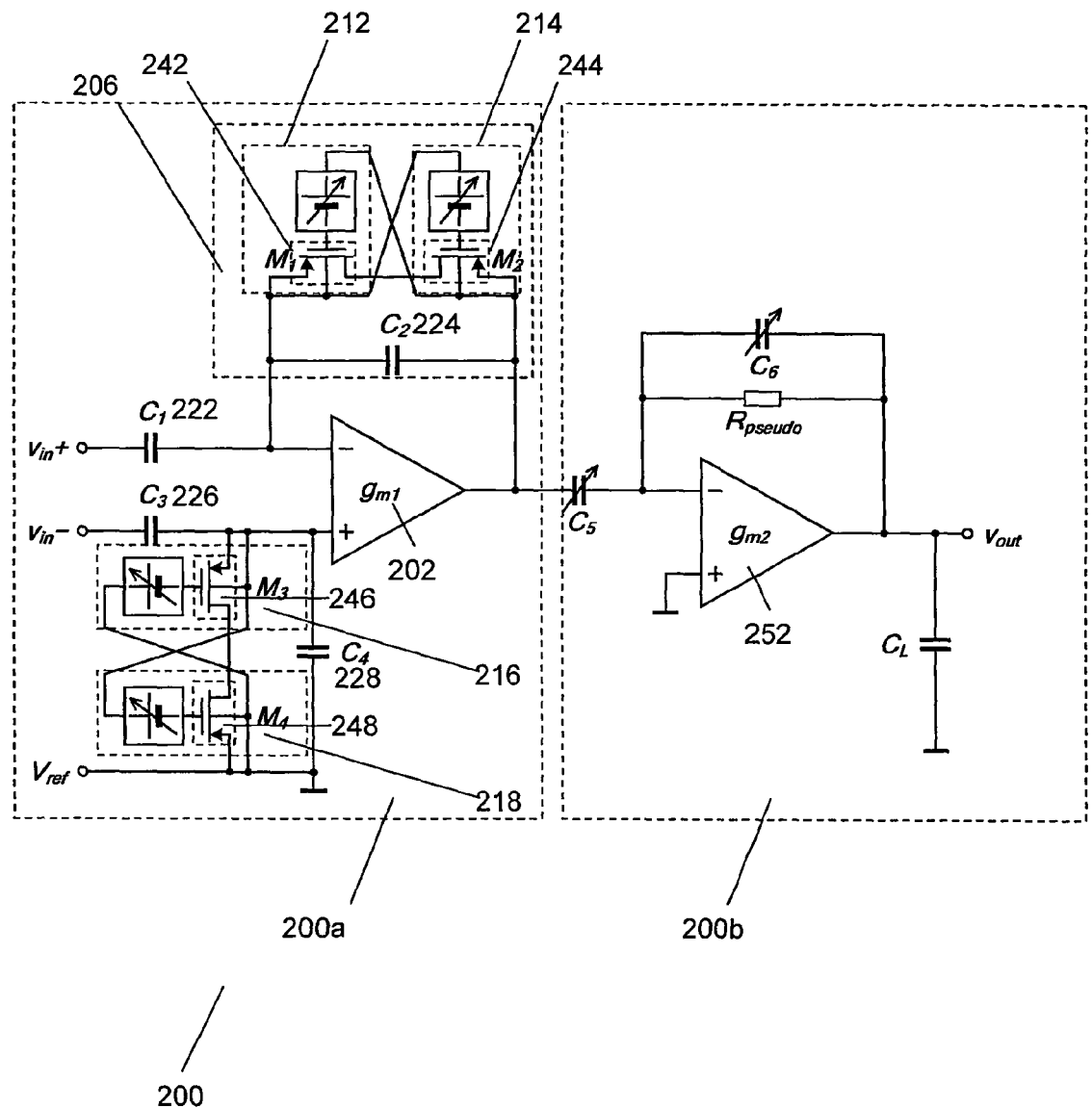
FIG. 2 illustrates the system architecture of an example embodiment of a fully tunable, low-voltage, full-swing CMOS amplifier.

FIG. 2 illustrates the system architecture of an example embodiment of a fully tunable, low-voltage, full-swing CMOS amplifier 200. It comprises a pre-amplification stage 200a (or the first stage) driven by the OTA labeled "$g_{m1}$" 202, and an adjustable gain stage 200b (or the second stage) by the OTA labeled "$g_{m2}$" 252. The first stage 200a amplifies the differential inputs and processes the signal with tunable high and low pass filtering provided by high-pass filter 206 and OTA 202 respectively; the second stage 200b adjusts the overall gain according to application requirements. Because of the small input amplitude of the first stage 200a and the inverting configuration of the second stage 200b, neither OTA 202 or 252 requires a rail-to-rail or wide-scale inputs, which can simplify the input pair design, and ease the noise efficiency factor (NEF) optimization.

The low-pass corner frequency of the system 200 can be easily tuned by shifting the dominant pole of the first-stage OTA, $g_{m1}$ 202. The bandwidth of the second stage 200b needs to be considerably larger to minimize its impact on the overall bandwidth adjustment. This can be fulfilled by setting the gain of the second stage 200b at least one order of magnitude smaller than that of the first stage 200a.

The high-pass corner frequency is adjusted by the feedback network of the first stage, through on-chip capacitor components $C_1$ 222, $C_2$ 224, $C_3$ 226, $C_4$ 228, and the tunable active resistors 212, 214, 216, 218. As the frequency of bio-signals can be as low as a few tens of milli-hertz in certain applications, the upper tuning limit of the active resistors 212, 214, 216, 218 may preferably be as high as $10^{13}$ ohm, provided that $C_2$ 224 and $C_4$ 228 are in pF range. The lower tuning limit is around $10^{11}$ ohm or lower, corresponding to a corner frequency of a few hertz or higher.

Figure 3A:
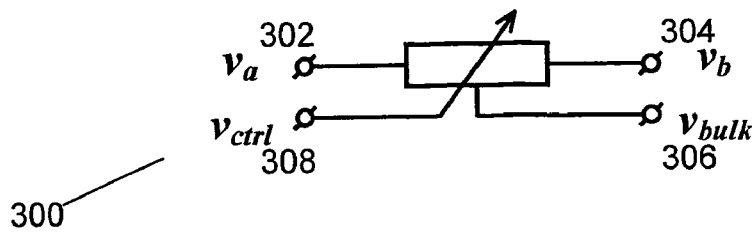
FIG. 3A shows a simplified model for a typical active resistor.

FIG. 3a displays the simplified model of a generic active resistor 300. The two terminals labeled "$v_a$" 302 and "$v_b$" 304 form the load of resistance. Terminal "$v_{bulk}$" 306 denotes the bulk tap of the active components. Terminal "$v_{ctrl}$" 308 represents the controlling mechanism that levels the active resistance.

Under typical operation conditions, at least one of the "$v_a$" 302 and "$v_b$" 304 terminals may experience a large voltage swing. While not posing any problem on a passive resistor, such a voltage swing can severely distort the resistance of a poorly controlled active resistor, making it highly non-linear. It is thereby preferable to adaptively bias the "$v_{ctrl}$" 308 terminal such as to maintain linearity of the active resistor.

Another potential problem associated with active resistors is the structural imbalance or asymmetry, measured by the differences of electrical properties perceived from either end of an active resistor as referenced to the other. As a consequence, the resistance generated from an active resistor is dependent on the polarity of voltage across it; in other words, applying the same potential difference across the active resistor but with opposite polarity produces different resistances. At small signal levels (e.g. comparable to the thermal voltage in CMOS circuits), the said imbalance can lead to inherent biasing offset; as the signal levels increase, the said imbalance can further lead to noticeable signal-dependent output shift and even early clippings at one of the power rails. This may be a primary limiting factor to the dynamic range performance in low-voltage circuits.

The structural imbalance can be related to the parasitic imperfections of the active devices. For instance, any junction leakage current occurring at the boundary of the structure (i.e. the interface between the active resistor structure and the bulk material) in the order of sub pA or larger may effectively establish references to external potentials. While not exerting any effect at low impedance nodes, it may considerably bias the high impedance nodes and in turn relate the circuit properties of interest (e.g. the equivalent resistance) to the external states of the structure (e.g. the average potential of the active resistor with respect to the bulk material). Therefore, it is preferable to source and process the leakage sensitive terminal "$V_{bulk}$" 306 such that high impedance termination is avoided.

The embodiments of the present invention seek to provide a general approach to the design of fully balanced active resistors with tunable low-distortion resistance. The inventors have identified some factors which may assist in reducing parasitic influences, listed as follows: 1) Ensuring topological and geometrical symmetry across the structure; 2) Sourcing the controlling terminal "$v_{ctrl}$" 308 and the parasitic terminal "$V_{bulk}$" 306 solely from the local low-impedance nodes of the active resistor 300; 3) Reconditioning the impedance across the structure boundary to avoid direct interface of local high-impedance nodes with external bulk material; 4) Through adaptively biasing the "$v_{ctrl}$" 308 terminal, keeping the resistance controlling factors (e.g. the overdrives of active components 242, 244, 246, 248 in FIG. 2) decoupled from external states (e.g. the voltage swing exerted at either end of the active load 302, 304) across the operation range of interest.

Figure 3B:
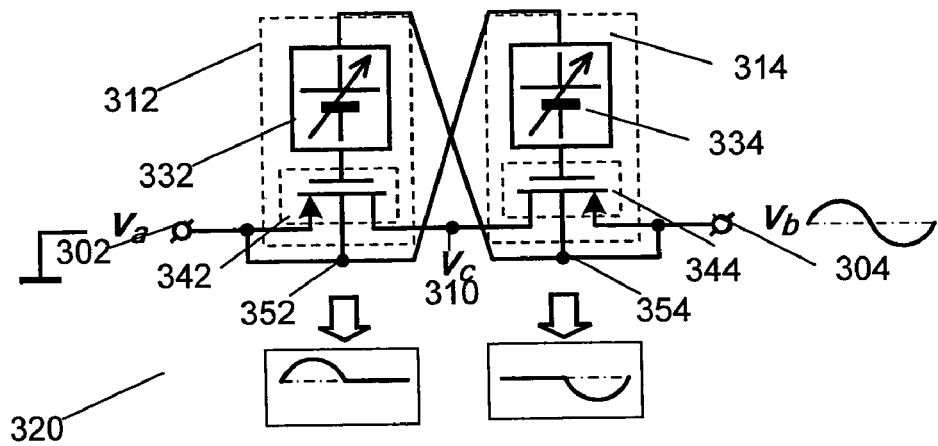
FIGS. 3B and 3C show the details of a fully balanced cross-coupled active resistor structure according to an example embodiment.

FIG. 3b shows a schematic diagram of a tunable active resistor structure 320 that produces balanced resistance with low distortion in an example embodiment. Two PMOS transistors 342 and 344 form the load and their gates are cross-coupled to the two end terminals "$v_a$" 322a and "$v_b$" 324a with the aid of two tunable resistance controllers 332, 334. The body terminals 352, 354 are tapped locally and sourced from the nearest end terminals.

NMOS transistors are not preferred as there are no deep n-well options in many CMOS processes, and the NMOS body in this case would normally be linked to fixed external sources (ground or $V_{ss}$), rendering the produced active resistance inherently sensitive to external signal states and parasitic leakages. The cross-coupled configuration that facilitates the resistance control and the localized symmetrical biasing of the transistor bodies are useful in reaching structural balance, details of which are provided later.

When applied to the circuit in FIG. 2, the embodied active resistors 212, 214, 216, 218 (312, 314 in FIG. 3) serve two roles. The primary role is to regulate the operating points of the first-stage amplifier 200a. More specifically, in static conditions with only DC biasing, the said active resistors 212, 214, 216, 218 force both the input and output nodes of the OTA "$g_{m1}$" 202 to be at $V_{ref}$ with negligible offset; while in dynamic conditions when AC signals are fed into the amplifier, the said active resistors 212, 214, 216, 218 hold the DC biasing levels with minimal signal-dependent shift, in spite of the large voltage swings they may be subjected to. One challenge of using active resistors 212, 214, 216, 218 in such a configuration can be the prolonged settling time. This challenge, however, may be addressed in, the embodiments of the present invention, as a lower resistance option (hence a smaller time constant) can be activated temporarily whenever the circuit 200a undergoes a serious biasing disturbance (e.g. during power up). Once the correct biasing points are attained or restored, the active resistors 212, 214, 216, 218 are adjusted back to their normal values.

The second role of the embodied active resistors 212, 214 is to regulate the feedback resistance of the first-stage amplifier 202. Due to the large voltage swings it constantly experiences, the active resistors 212, 214 formed by $M_1$ 242 and $M_2$ 244 are the main contributor to the signal distortions in the preamplifier. Assuming that there is no clipping at either side of the power rails, a large sine wave output should ideally be symmetrically swinging around the output biasing level (preferably at $V_{ref}$). As is more clearly depicted in FIG. 3b, during the positive half cycle of the sine wave, the gate of $M_1$ 342 and node "$v_b$" 304 of $M_2$ 344 are charged up, while the gate of $M_2$ 344 and node "$v_a$" 302 of $M_1$ 342 remain virtually constant. This voltage assignment tends to turn on $M_2$ 344 while keeping $M_1$ 342 shut, thereby effectively distributing the whole output across $M_1$ 342. Conversely, during the negative half cycle, $M_1$ 342 sees a large negative gate to source voltage ($V_{gs}$) and tends to turn on, thereby leaving the output solely to the now virtually shut $M_2$ 344. Consequently, each transistor works as an active resistor for only half of each output cycle, and the $V_{gs}$ of the transistor in use (as the active resistor) is always defined by the associated tunable resistance controller 332, 334. This helps to sustain the order of the incremental resistance across a relatively large output range until the voltage drop ($V_{ds}$) on the transistor in use begins to considerably turn on its source to bulk p-n junction.

It will be appreciated by a person skilled in the art that active resistors 216, 218 coupled at the non-inverting input of the OTA "$g_{m1}$" 202 function in substantially the same manner as that described for the active resistors 212, 214. They may, however, see, smaller signal swing and hence pose less threat of producing distortions.

In the process described above, the external state (or more specifically, the overall voltage level) of the active resistor structure with respect to the power rails tracks the output and keeps alternating encompassing the output biasing level. The localized symmetrical connections of the PMOS bulks, in this case, assist to make, the active resistance of the structure irrelevant to the said external state. Another way of biasing the bulks that may be similarly effective is to tap them to the mid node "$v_c$" 310, which theoretically should produce even better linearity at very large voltage swings as it eliminates the undesired current paths across the source to bulk p-n junctions. However, a closer examination may reveal that connecting both bulks to a high impedance node ("$v_c$") exposes the "$V_{bulk}$" terminal, of the active resistor directly to the n-well to substrate leakage path, hence creating dependence upon external states, which may break the structural balance.

Figure 3C:
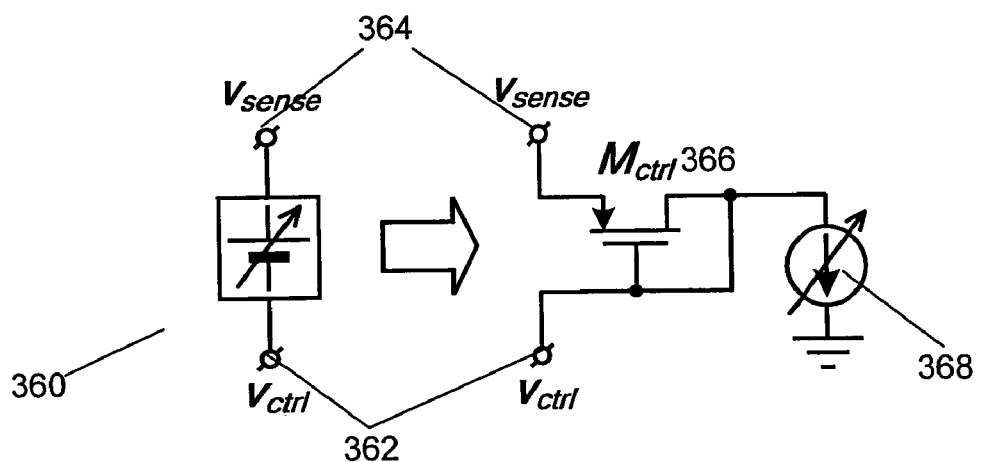

FIG. 3c depicts an embodiment of the tunable resistance controller 360 (332, 334 in FIG. 3b). It is essentially a variable voltage source that defines the voltage at terminal "$v_{ctrl}$" 362 as referenced to terminal "$V_{sense}$" 364. PMOS $M_{ctrl}$ 366 serves to map the required voltage drop to a variable current source 368, which usually is more accurately and linearly controllable. In deep-sub-micron processes, e.g. 0.18-μm CMOS or lower, where transistors present substantial off-state channel leakage, the said current source can be configured bidirectional if needed, to cover the otherwise missing high resistance end in the tuning range of the active resistor.

Returning to FIG. 2, the second stage 200b of the embodied fully tunable amplifier 200 is a programmable-gain buffer (PGB) that regulates the gain and buffers the load. The gain adjustment feature in the embodiments of the present invention is implemented separately from the band-pass preamplifier to avoid the gain-bandwidth correlation produced by the first-stage OTA 202. The load buffering scheme relaxes the output requirement of the preamplifier, and is power-efficient especially when the load continuously exerts disturbance to the system (e.g. in a sample-and-hold S/H circuit).

Figure 4A:
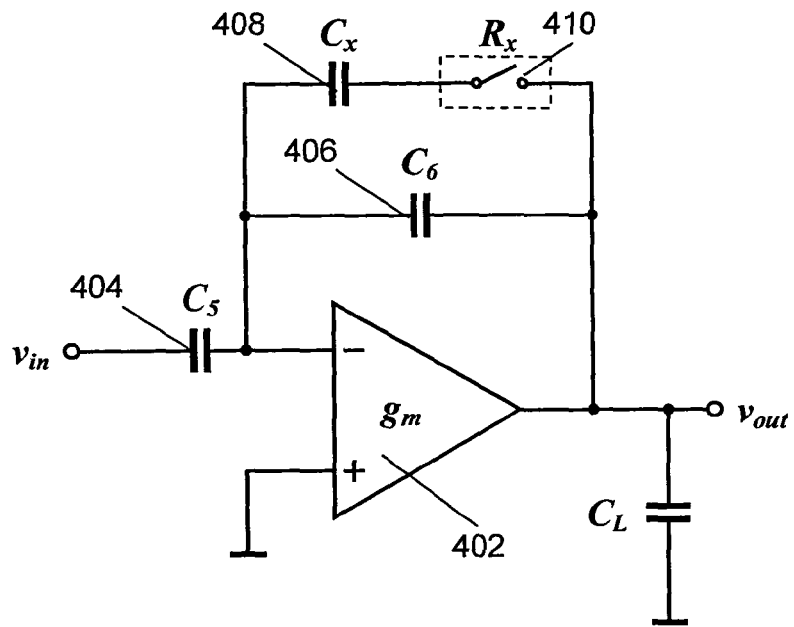
FIG. 4A shows the typical gain tuning scheme in the state of the art.

The voltage gain of a closed-loop amplifier is adjustable through varying its feedback factor. A common approach in the art is to use a switch to connect or disconnect a feedback path, as illustrated in FIG. 4a. Assuming the OTA "$g_m$" 402 is ideal, the closed-loop gain is determined by the capacitance ratio of $C_5$ 404 to those in the feedback paths 406, 408. However, this may not hold for all frequencies. For instance, at very low frequency when the reactance of $C_x$ 408 becomes comparable to the off-state resistance $R_x$ 410 of the corresponding control switch, the closed-loop gain is more precisely estimated by $$G = \frac{C_5}{C_6} \cdot \frac{sC_xR_x + 1}{sC_xR_x + 1 + C_x/C_6}. \quad (1)$$

Since $C_x$ 408 is typically comparable to $C_6$ 406, the resultant non-overlapping zero-pole pair distorts the frequency response with a localized gain boost. Given $C_x$ in pF range and $R_x$ approximately at $10^{13}$ ohm, the said distortion occurs at around sub 1 hertz to a few hertz, hence interfering with the high-pass function of the preamplifier.

Figure 4B:
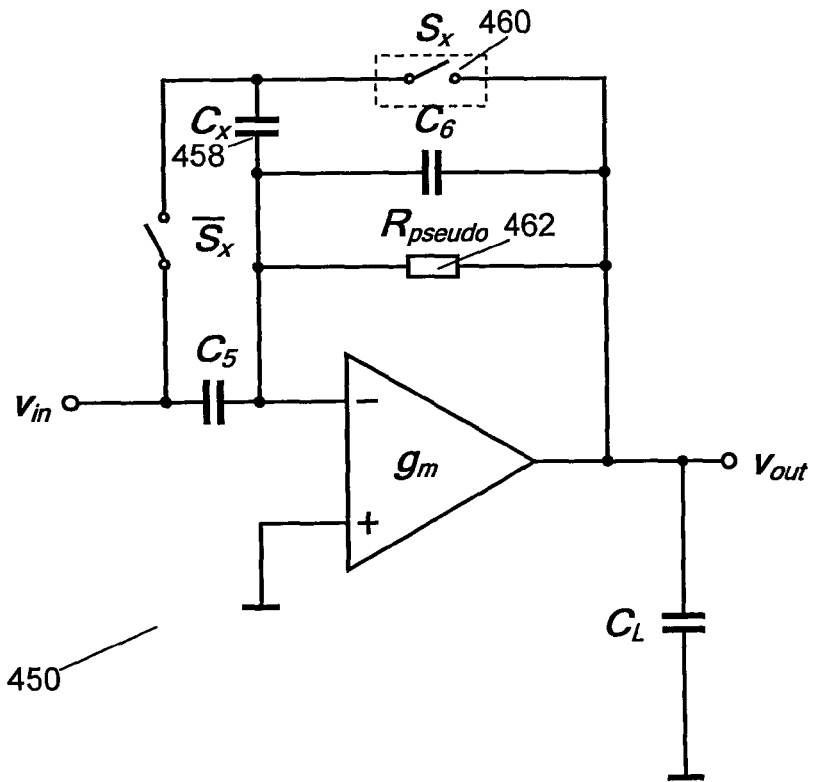
FIG. 4B shows a schematic diagram of the adjustable gain stage of an example embodiment.

FIG. 4b shows a schematic diagram of the adjustable gain stage PGB 450 of an example embodiment. The embodied "flip-over-capacitor" scheme can correct the said problem by "flipping" the gain control capacitor $C_x$ 458 between the input and feedback paths. Hence, $C_x$ 458 functions as a part of the input capacitor in the high gain mode and as a part of the feedback capacitor in the low gain mode. The off-state resistance $R_x$ of the corresponding switch $S_x$ 460 gets excluded from the gain control feedback loop and behaves only as a negligible load to the first-stage amplifier and the PGB 450, hence preferably eliminating the threat of distorted frequency response in the sub 1 hertz to a few hertz range.

The DC biasing points of the PGB 450 are regulated by a pseudo-resistor $R_{pseudo}$ 462 in the feedback path. Since it is not involved in the bandwidth or gain adjustment, $R_{pseudo}$ 462 can adopt any fully balanced form of a fixed pseudo-resistor. Preferably however, the induced high-pass corner frequency should not interfere with the bandwidth control of the first-stage amplifier.

Finally, the choice and design of the two OTAs 202, 252 (FIG. 2) in the preamplifier 200a and the PGB 200b are crucial to the overall noise efficiency. Given that the first-stage amplifier 200a delivers a primary part of the voltage gain, its input pair becomes the most critical sub-circuit that quantifies the noise figure. Therefore, a considerably large amount of current is preferably invested here. On the other hand, the output stage of the PGB 252 is preferably capable of driving large capacitive loads with a sufficient bandwidth and slew rate, hence requiring the second largest portion of current. By properly allotting the current among these and other sub-circuits, one can achieve an optimal balance between the noise figure and the overall power consumption.

A 1-V fully integrated amplifier based on the disclosed embodiment of the invention was fabricated in a standard 0.35-μm CMOS process. Targeting primarily at ultra-low-power electrocardiograph (ECG) acquisition, the amplifier was designed to operate in a tunable pass-band from close to DC to up to 300 Hz, with voltage gain adjustable from 200 to 1000.

Figure 5A:
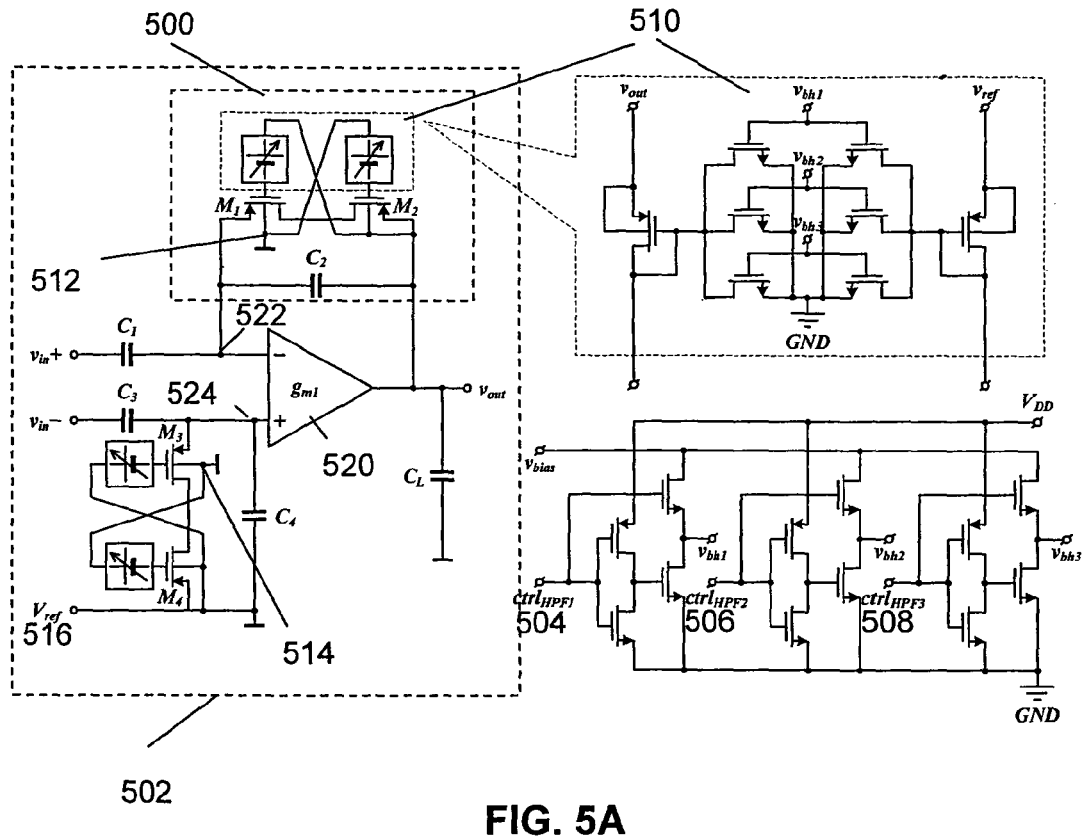
FIG. 5A shows the preamplifier feedback circuit in the example implementation of the present invention.

FIG. 5a shows the implemented feedback loop 500 of the preamplifier 502. 3-bit programmable current sources controlled by "$ctrl_{HPF1}$" 504, "$ctrl_{HPF2}$" 506 and "$ctrl_{HPF3}$" 508 are used to adjust the voltage outputs of the tunable resistance controllers 510, which in turn set the desired active resistance and high-pass corner frequency. Note that for use in the pre-amplification stage in this embodiment, the $M_1$ bulk to $M_2$ gate controller tap 512 and the $M_3$ bulk to $M_4$ gate controller tap 514 are routed to the voltage source $V_{ref}$ 516 instead of to the two input nodes 522, 524 of OTA "$g_{m1}$" 520. This is because CMOS OTAs feature high-impedance capacitive inputs that are susceptible to parasitic leakage. Sourcing the bulk-to-gate-controller taps here would compromise the aforementioned second factor for reducing parasitic influences to achieve structural balance in active resistors. The routing applied in the example implementation can reduce such risk with negligible disturbance to the electrical symmetry of the structure, as OTA inputs 522, 524 should ideally be biased at $V_{ref}$, superimposed by virtually zero AC components.

Figure 5B:
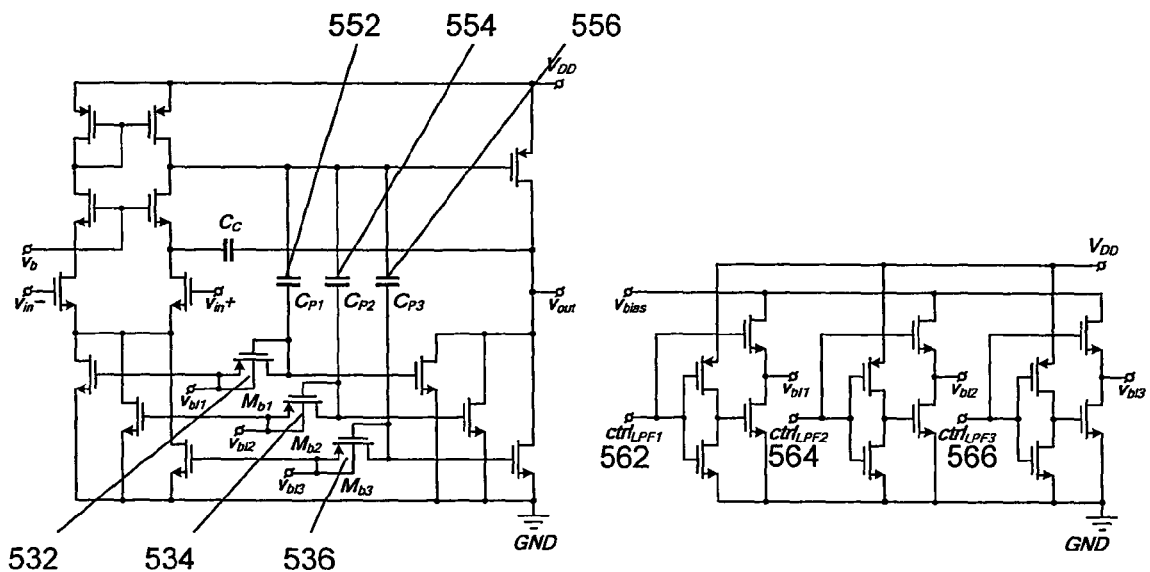
FIG. 5B shows the preamplifier OTA circuit in the example implementation of the present invention.

The implemented first-stage OTA 520 employs the structure of a two-stage Miller-compensated op-amp that incorporates a push-pull output scheme, as illustrated in FIG. 5b. With most transistors biased in subthreshold region, over 80% of the total preamplifier current is dedicated to the input pair to produce sufficient input transconductance, which translates to suppressed input-referred noise. The output stage consumes the rest small portion of current and utilizes the push-pull scheme facilitated by $C_{P1}$ 552, $C_{P2}$ 554 and $C_{P3}$ 556 to achieve adequate driving capacity. Pseudo-resistors $M_{b1}$ 532, $M_{b2}$ 534, $M_{b3}$ 536 serve to set the DC biasing current in the output stage, and behave AC open-circuited to the push-pull operations. The dominant pole of the OTA 550 (hence the low-pass corner frequency of the overall amplifier) gets adjusted by programming the 3-bit current sources in both stages through "$ctrl_{LPF1}$" 562, "$ctrl_{LPF2}$" 564 and "$ctrl_{LPF3}$" 566.

The OTA 252 (FIG. 2) implemented in the PGB 200b adopts a similar, topology as that in the first-stage amplifier 520 (FIG. 5), except that the current distribution favours the output stage instead, such that the amplifier is able to drive large capacitive loads or disturbing S/H loads.

Figure 6A:
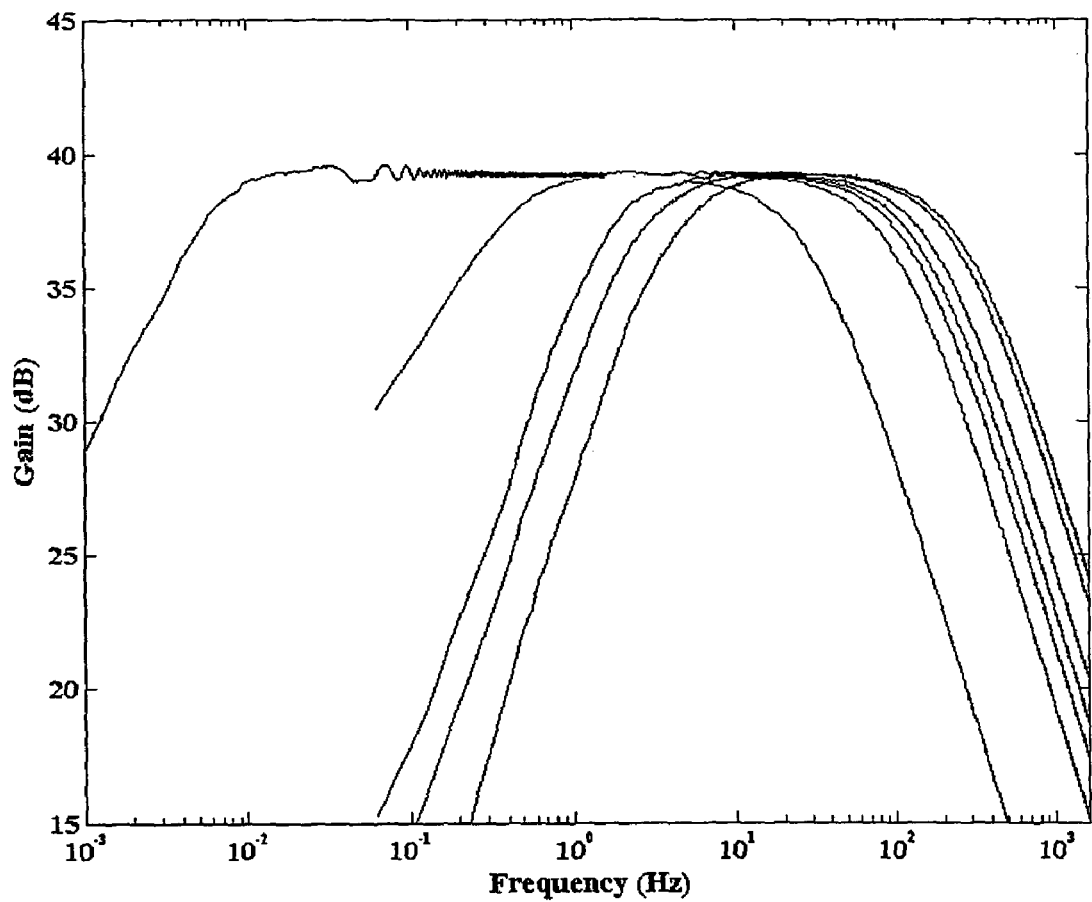
FIG. 6A shows the measured frequency responses with different corner frequencies in the example implementation of the invention.
Figure 6B:
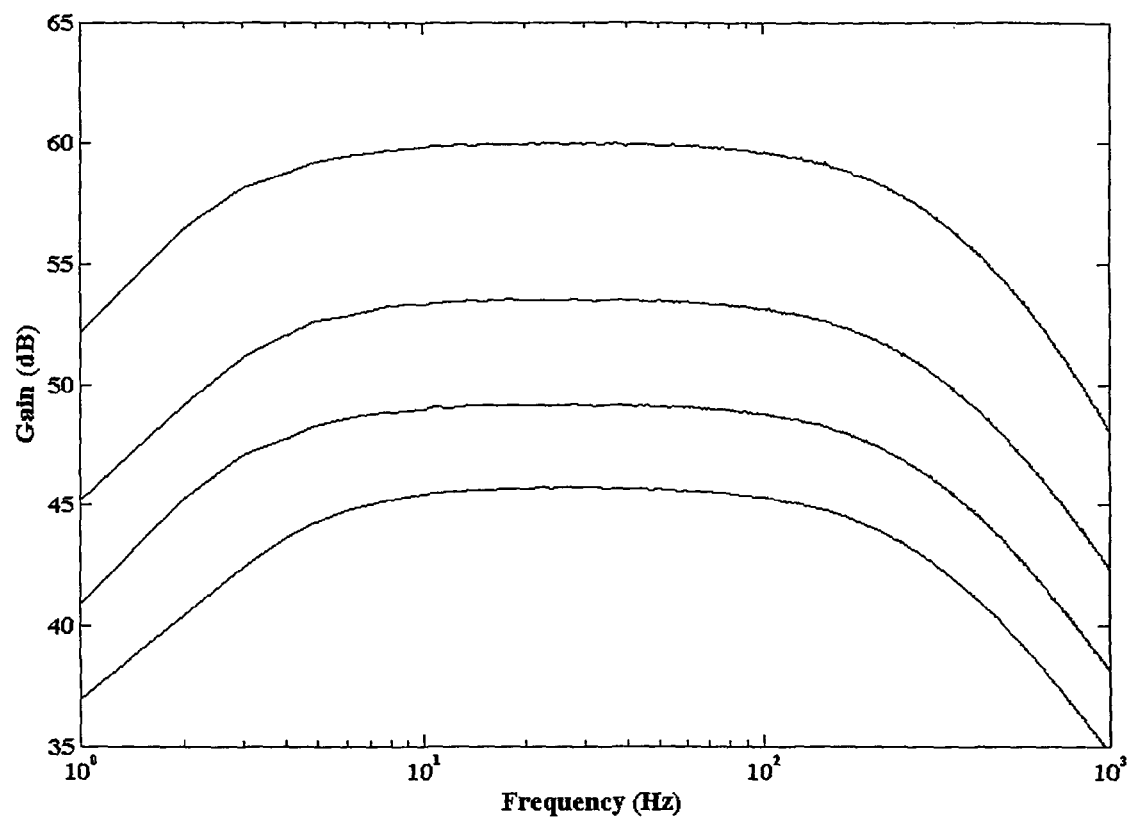
FIG. 6B shows the measured frequency responses with different gains in the example implementation of the invention.

The fabricated circuit was tested under 1-V supply when loaded with a 64 pF capacitor. FIG. 6a displays the frequency response curves as the preamplifier gets programmed to different corner frequency presets. The high-pass corner frequency can be tuned from 4.5 mHz to 3.5 Hz, whereas the low-pass corner frequency can be tuned from 30 Hz to 292 Hz. FIG. 6b depicts the frequency responses as the overall gain is adjusted through the PGB. It is well noticeable that the measured mid-band gain scales from 45 dB to 60 dB without altering the bandwidth or distorting the response curve.

Figure 6C:
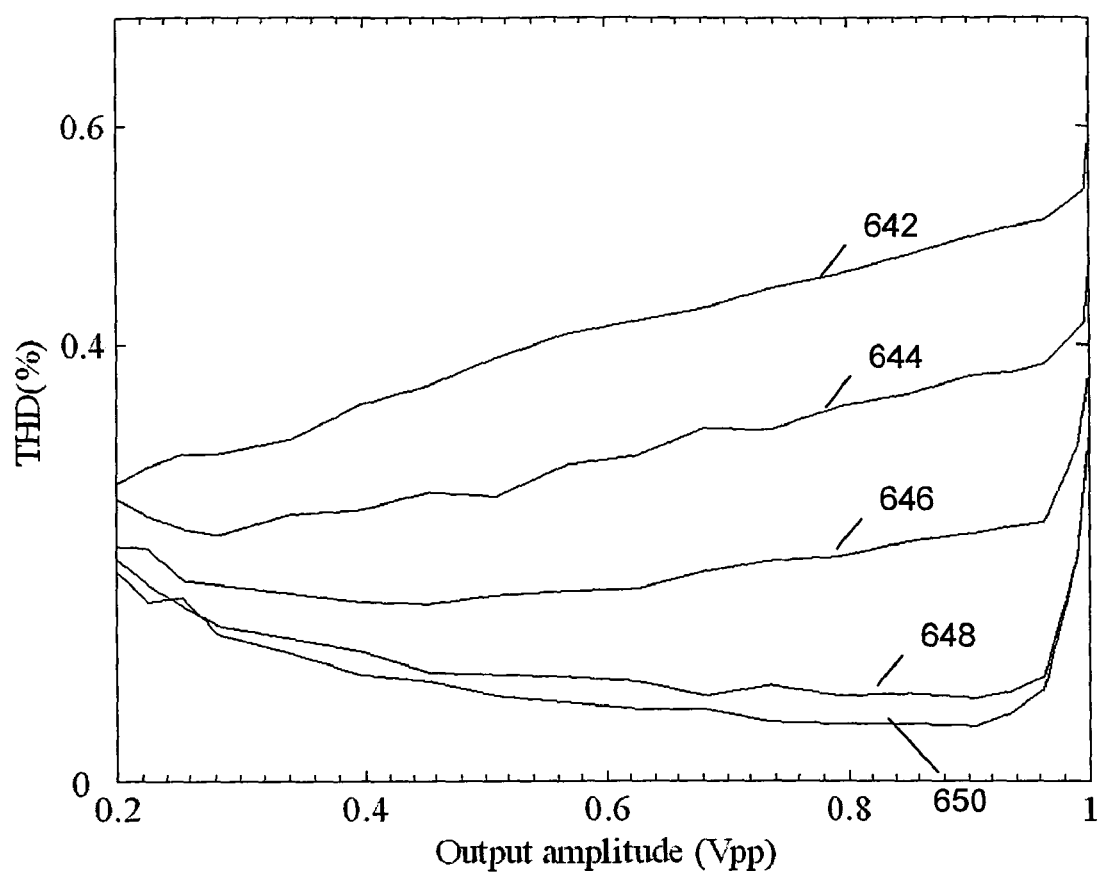
FIG. 6C plots the measured THD against the output amplitude with different high-pass corner frequencies in the example implementation of the invention.

The other focus in the testing was the signal fidelity. Since most of the signal degradation occurs at the tunable active resistors, different high-pass corner frequency presets (corresponding to different active resistance levels) were tested. The measured total harmonic distortion (THD) against the output amplitude is plotted in FIG. 6c, wherein the curves 642, 644, 646, 648 and 650 correspond to corner frequencies of 3.5 Hz, 2.2 Hz, 1.4 Hz, 250 mHz and 4.5 mHz, respectively. It is seen that the maximum THD occurs with 3.5 Hz preset, as the amplifier approaches rail-to-rail output, and is no larger than 0.6%, allowing full scale output range to be used in dynamic range evaluations for most applications.

FIG. 7 shows a table concluding some of the measurement results of the implemented amplifier. It is seen that with the maximum current of 337 nA (corresponding to the largest bandwidth of 292 Hz), the input-referred noise integrates to 2.5 $\mu V_{rms}$ across the equivalent noise band (signal bandwidth extended by $\pi/2$), giving rise to a decent NEF of 3.26. As the THD is less than 1% even with full-swing output, the usable dynamic range reaches 58 dB, which is exceptional in low-voltage circuits.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A tunable active resistor structure comprising two symmetrically cross-coupled transistors, a first variable source coupled between a gate of one of the transistors and a source of the other transistor, and a second variable source coupled between a gate of said other transistor and a source of said one transistor for providing tunability to the active resistor structure.

2. The resistor structure as claimed in claim 1, wherein said first and second variable sources each comprise a variable voltage source.

3. The resistor structure as claimed in claim 2, wherein said variable voltage source comprises a source transistor for mapping a required voltage drop to a variable current source.

4. The resistor structure as claimed in claim 1, wherein a source and bulk of one of the transistors are coupled to the gate of the other transistor and vice versa.

5. The resistor structure as claimed in claim 1, wherein said transistors comprise PMOS transistors.

6. A CMOS amplifier with integrated tunable band-pass function comprising one or more active resistor structures as claimed in claim 1.

7. The amplifier as claimed in claim 6, comprising a separate pre-amplification stage and a gain tuning stage.

8. The amplifier as claimed in claim 7, wherein the pre-amplification stage comprises said active resistor structures.

9. The amplifier as claimed in claim 6, wherein transistors of the amplifier are biased in a subthreshold region under low-voltage supply operation.

10. The amplifier as claimed in claim 9, wherein capacitive inputs of the pre-amplifier stage are employed to reject DC and predefined low-frequency contents.

11. The amplifier as claimed in claim 10, wherein the high-pass corner frequency is arranged for reaching down to sub 1 Hz and is defined by the on-chip active resistors.

12. The amplifier as claimed claim 6, wherein the said active resistors exhibit substantially no external state related imbalance for reducing or eliminating signal dependent output shift.

13. The amplifier as claimed in claim 6, wherein the said active resistors exhibit substantially no signal dependent resistance variation for reducing non-linearity.

14. The amplifier as claimed in claim 6, wherein a THD with rail-to-rail output of the amplifier is less than 1% for offering a substantially optimum signal amplitude in dynamic range evaluations.

15. The amplifier as claimed in claim 6, wherein a dominant pole of the amplifier provides the low-pass function.

16. The amplifier as claimed in claim 15, wherein the dominant pole is adjustable by tuning a current of an OTA of the pre-amplification stage.

17. The amplifier as claimed in claim 16, having a low power consumption of less than 1 $\mu$W.

18. The amplifier as claimed in claim 6, wherein the gain tuning stage comprises switchable capacitive feedback paths to adjust closed-loop gain.

19. The amplifier as claimed in claim 18, comprising a switchable capacitor network to flip over between an input and a feedback paths during gain adjustment.

20. A method of amplifying an input signal using an amplifier as claimed in claim 6.

21. A method of fabricating an amplifier as claimed in claim 6.

* * * * *